(12) United States Patent
Wang et al.

(10) Patent No.: US 8,599,049 B2
(45) Date of Patent: Dec. 3, 2013

(54) DYNAMIC DECODING LOOKUP TABLE GENERATION METHOD AND ELECTRONIC DEVICE APPLYING THE SAME

(75) Inventors: Wen-Shan Wang, Taipei (TW); Tse-Min Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 73 days.

(21) Appl. No.: 13/218,973

(22) Filed: Aug. 26, 2011

(65) Prior Publication Data

US 2012/0169518 A1     Jul. 5, 2012

(30) Foreign Application Priority Data

Dec. 31, 2010   (TW) ................................ 99147345 A

(51) Int. Cl.
*H03M 7/00* (2006.01)
(52) U.S. Cl.
USPC ............... 341/106; 341/65; 341/67; 341/107
(58) Field of Classification Search
USPC ............................................. 341/65, 67, 106
See application file for complete search history.

(56) References Cited

U.S. PATENT DOCUMENTS

| 5,541,595 | A | * | 7/1996 | Meyer | 341/67 |
| 5,703,580 | A | * | 12/1997 | Ko | 341/59 |
| 5,933,103 | A | * | 8/1999 | Kim | 341/59 |
| 7,043,088 | B2 | * | 5/2006 | Chiu et al. | 382/233 |
| 7,898,444 | B2 | * | 3/2011 | Wang et al. | 341/65 |
| 2006/0176960 | A1 | * | 8/2006 | Lu et al. | 375/240.23 |
| 2008/0204287 | A1 | * | 8/2008 | Puri et al. | 341/67 |
| 2009/0161974 | A1 | | 6/2009 | Bjontegaard et al. | |
| 2010/0013680 | A1 | | 1/2010 | Chen et al. | |
| 2010/0013681 | A1 | * | 1/2010 | Chen et al. | 341/67 |
| 2010/0023708 | A1 | | 1/2010 | Feng et al. | |

FOREIGN PATENT DOCUMENTS

| TW | 200815980 | 4/2008 |
| TW | 200838157 | 9/2008 |

OTHER PUBLICATIONS

English language translation of abstract of TW 200815980 (published Apr. 1, 2008).
English language translation of abstract of TW 200838157 (published Sep. 16, 2008).
Guanghua, C., et al; "A Fast Variable-Length Decoder with Optimized Lookup Tables on FPGA;" IEEE; 2004; pp. 1649-1652.

* cited by examiner

*Primary Examiner* — Linh Nguyen
(74) *Attorney, Agent, or Firm* — McClure, Qualey & Rodack, LLP

(57) ABSTRACT

A dynamic decoding lookup table generation method is provided. The generation method includes: receiving a variable length coding (VLC) table; and dynamically establishing an adaptive decoding lookup table from the VLC table according to a target decoding rate and a free system memory resource.

20 Claims, 2 Drawing Sheets

DYNAMIC DECODING LOOKUP TABLE GENERATION METHOD AND ELECTRONIC DEVICE APPLYING THE SAME

This application claims the benefit of Taiwan application Serial No. 99147345, filed Dec. 31, 2010, the subject matter of which is incorporated herein by reference.

BACKGROUND

1. Technical Field

The disclosure relates in general to a method for generating a dynamic decoding lookup table and a portable electronic device applying the same.

2. Background

Along with advance in video multimedia technology and communication technology, new multimedia communication applications are continuously provided. In general, multimedia communication is used in the transmission and storage of large information, and involves data compression technology. The data compression technology includes a data lossless compression and a data loss compression. The variable length coding (VLC) algorithm is common. According the VLC algorithm, the symbol with low possibility is encoded into long bits, and symbols with high possibility is encoded into short bit, so that data is compressed during data encoding. In recent years, the VLC algorithm has been widely used in various video encoding/decoding protocols.

Since the encoding protocols are complicated, and most embedded systems use low-level processors, the mobile device is normally equipped with a multimedia hardware accelerator for implementing various encoding/decoding protocols or is even equipped with an application-specific integrated circuit (ASIC) capable of encoding/decoding data. Thus, many variable length encoding/decoding algorithms and their hardware frameworks are developed. As for an ASIC, the memory is important and occupies circuit area and circuit cost.

As the embedded processor technology is getting more and more matured, various encoding/decoding protocols may achieve real-time processing by software, and there is no need for the dedicated ASIC to implement the encoding/decoding protocols. The system on chip (SoC) is programmable and accordingly is useful in various encoding/decoding protocols. The memory in the embedded system is limited and is shared by various application programs. If the length of the VLC decoder lookup table is fixed, the system efficiency will deteriorate accordingly. Since in various embedded system platforms, the memories are not designed for special purposes, the free memory size depends on different platforms and different program execution combination. Consequently, in designing the VLC decoder lookup table, the memory allocation issue is to be considered.

In the embedded system, the memory is shared by programs. Therefore when allocating the memory for the VLC decoder lookup table, what is considered is more than the efficiency of one single program. Let the VLC decoder be taken for example. Suppose there are two decoding algorithms A and B. The decoding algorithm A requires a memory space of 20 KB, and the decoding rate of the algorithm A is 2 lookups per symbol. The decoding algorithm B requires a memory space of 30 KB, and the decoding rate of the algorithm B is 1.8 lookups per symbol. If the system has 32 KB free memory space, then the decoding algorithm B is not the only choice, because the embedded system may execute other application programs which also require memory. Thus, how to make good use of limited memory resource is essential to the embedded system.

Moreover, according to the current algorithm for generating decoding lookup tables, the algorithm is fixed once selected. Under such circumstances, if the system efficiency or system resources are dynamically changed, it would not generate appropriate decoding lookup tables.

BRIEF SUMMARY

The disclosure is directed to a method for generating dynamic decoding lookup table and a portable electronic device applying the same. Based on the system memory resource and/or the current system work load and/or the target decoding rate, a decoding lookup table (or lookup table) applicable to the system environment is dynamically generated.

A method for generating a decoding lookup table is disclosed in an exemplary embodiment of the present disclosure. The generation method includes: receiving a variable length coding (VLC) table; and dynamically establishing an adaptive decoding lookup table from the VLC table according to a target decoding rate and a free system memory resource.

A portable electronic device is disclosed in another exemplary embodiment of the present disclosure. The portable electronic device includes: a memory, storing a variable length coding (VLC) table; and a processing unit, dynamically establishing an adaptive decoding lookup table from the VLC table according to a target decoding rate and a free system memory resource.

It is to be understood that both the foregoing general description and the following detailed description are exemplary and explanatory only and are not restrictive of the disclosed embodiments, as claimed.

DETAILED DESCRIPTION OF THE DISCLOSURE

Figure 1:
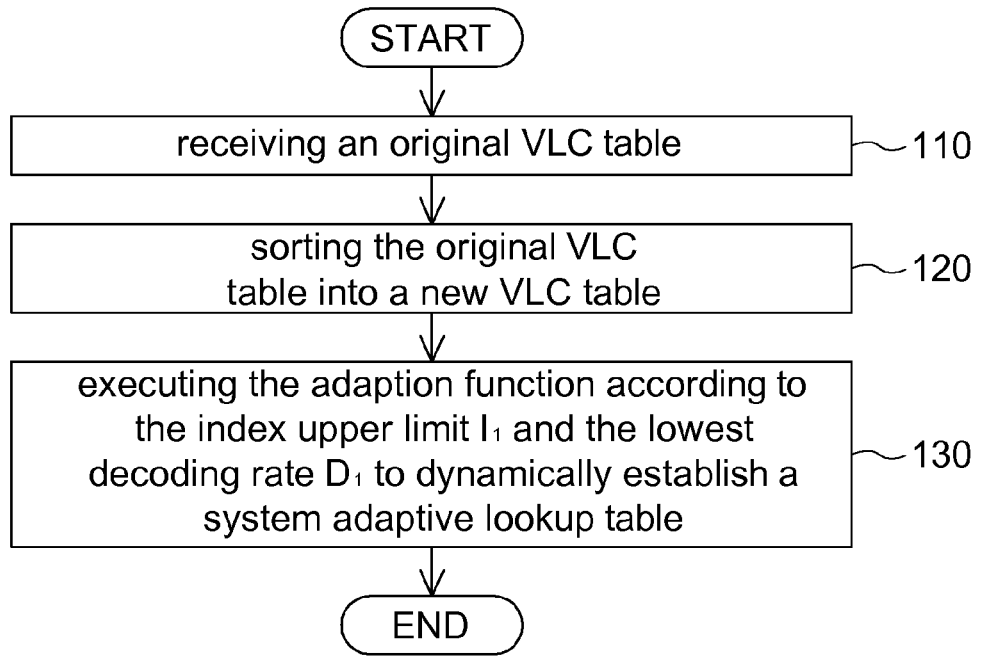
FIG. 1 shows an operation flowchart of an embodiment of the present disclosure.

A method for dynamically generating VLC decoder lookup table is provided in embodiments of the present disclosure. Adaptive VLC decoder lookup tables are dynamically generated according to the current decoding rate and/or the free system memory resource and/or the system work load. In the embodiments of the present disclosure, corresponding lookup table size and decoding rates of various VLC decoding lookup tables with respect to various possible VLC decoder lookup table establishing algorithms are estimated, and the memory resource and the efficiency of the system are considered for dynamically generating VLC decoder lookup tables applicable to the system environment. Usually, the lookup table with larger size has faster decoding speed but needs larger memory resource. How to find the balance point the decoding speed and memory resource is one of topics of this disclosure.

During execution of an embedded system, its free system memory resource and its system work load are variable. In the embodiments of the present disclosure, the lookup tables (LUT) adapted to the system environment (the system environment referring to for example but not limited to the free system memory resource and/or the system work load) are dynamically generated, and the memory space may be reserved for other application software. In the embodiments of the present disclosure, the lookup tables are automatically and dynamically established for decoding according to the free system memory resource and/or the system work load and/or the target decoding rate.

First Embodiment

In decoding the VLC codes, the codes are looked up in rounds, and the syntax element (SE) corresponding to the codes (that is, the symbol) is closer after rounds. There are two categories of lookup table establishing algorithms (or, VLC decoding algorithms), namely, the fixed length (FL) algorithm and the leading bit algorithm. The lookup table establishment may use a fixed length algorithm, a leading algorithm, or mixture of these algorithms. In decoding the VLC codes, in each round, it will use the same algorithms as those when the lookup table was established. The length in the fixed length decoding algorithm may vary from one round to another round. The leading bit in the leading bit decoding algorithm may be either 0 (referred as leading bit 0) or 1 (referred as leading bit 1) from one round to another. For the purpose of simplicity, the fixed length decoding algorithm is used below for exemplification purpose. However, the present embodiments of the disclosure may also use other algorithms for establishing decoding lookup tables. The number of VLC tables may be plural. If the number of VLC tables is plural, then a plurality of corresponding lookup tables are obtained. If the lookup table establishment needs more than one round, then the lookup table for the first round is placed in the initial address, and the lookup table for the next round is sequentially placed after the memory address of the lookup table for the previous round.

A VLC table contains several valid VLC codes (abbreviated as VLC codes), and a corresponding VLC decoder lookup table is required for decoding the VLC codes. Different VLC tables require different lookup tables, but different VLC tables may share the same procedure as long as the lookup tables are generated by the same table establishing algorithm.

Table 1 shows a sorted VLC table (containing 16 valid VLC codes).

TABLE 1

| Sorted VLC | |
| --- | --- |
| SE | Code |
| 11 | 000 |
| 13 | 001 |
| 14 | 010 |
| 4 | 0110 0 |
| 8 | 0110 1 |
| 0 | 0111 0 |
| 6 | 0111 1 |
| 15 | 10 |
| 9 | 1100 0 |
| 3 | 1100 1 |
| 5 | 1101 0 |
| 10 | 1101 1 |
| 12 | 1110 0 |
| 1 | 1110 10 |
| 2 | 1110 11 |
| 7 | 1111 |

Table 2(a)~Table 2(f) respectively show the changes in the original VLC table after the first time (also referred as the first round) of lookup table establishment is executed on Table 1 according to 6 kinds of fixed length decoding algorithms respectively. Letters with gray background denote the bits consumed after the first round. Letters without background denote the sub VLC table which is newly generated. F denotes the length in the fixed length decoding algorithm, which is also the number of bits used for establishing the corresponding lookup table.

The algorithm used in establishing the lookup tables will be the lookup algorithm used for subsequent decoding. If the fixed length decoding algorithm with fixed length N is used in the first round of the lookup table establishment, the fixed length decoding algorithm with fixed length N will be used in the first round decoding. Similarly, if the fixed length decoding algorithm with fixed length M is used in the second round of the lookup table establishment, then the fixed length decoding algorithm with fixed length M will be used in the second round decoding.

TABLE 2(a)

| FL, F = 1 | |
| --- | --- |
| SE | Code |
| 11 | 000 |
| 13 | 001 |
| 14 | 010 |
| 4 | 0110 0 |
| 8 | 0110 1 |
| 0 | 0111 0 |
| 6 | 0111 1 |
| 15 | 10 |
| 9 | 1100 0 |
| 3 | 1100 1 |
| 5 | 1101 0 |
| 10 | 1101 1 |
| 12 | 1110 0 |
| 1 | 1110 10 |
| 2 | 1110 11 |
| 7 | 1111 |

TABLE 2(b)

| FL, F = 2 | |
| --- | --- |
| SE | Code |
| 11 | 000 |
| 13 | 001 |
| 14 | 010 |
| 4 | 0110 0 |
| 8 | 0110 1 |
| 0 | 0111 0 |
| 6 | 0111 1 |
| 15 | 10 |
| 9 | 1100 0 |
| 3 | 1100 1 |
| 5 | 1101 0 |
| 10 | 1101 1 |
| 12 | 1110 0 |
| 1 | 1110 10 |
| 2 | 1110 11 |
| 7 | 1111 |

TABLE 2(c)

| FL, F = 3 | |
|---|---|
| SE | Code |
| 11 | 000 |
| 13 | 001 |
| 14 | 010 |
| 4 | 0110 0 |
| 8 | 0110 1 |
| 0 | 0111 0 |
| 6 | 0111 1 |
| 15 | 10 |
| 9 | 1100 0 |
| 3 | 1100 1 |
| 5 | 1101 0 |
| 10 | 1101 1 |
| 12 | 1110 0 |
| 1 | 1110 10 |
| 2 | 1110 11 |
| 7 | 1111 |

TABLE 2(d)

| FL, F = 4 | |
|---|---|
| SE | Code |
| 11 | 000 |
| 13 | 001 |
| 14 | 010 |
| 4 | 0110 0 |
| 8 | 0110 1 |
| 0 | 0111 0 |
| 6 | 0111 1 |
| 15 | 10 |
| 9 | 1100 0 |
| 3 | 1100 1 |
| 5 | 1101 0 |
| 10 | 1101 1 |
| 12 | 1110 0 |
| 1 | 1110 10 |
| 2 | 1110 11 |
| 7 | 1111 |

TABLE 2(e)

| FL, F = 5 | |
|---|---|
| SE | Code |
| 11 | 000 |
| 13 | 001 |
| 14 | 010 |
| 4 | 0110 0 |
| 8 | 0110 1 |
| 0 | 0111 0 |
| 6 | 0111 1 |
| 15 | 10 |
| 9 | 1100 0 |
| 3 | 1100 1 |
| 5 | 1101 0 |
| 10 | 1101 1 |
| 12 | 1110 0 |
| 1 | 1110 10 |
| 2 | 1110 11 |
| 7 | 1111 |

TABLE 2(f)

| FL, F = 6 | |
|---|---|
| SE | Code |
| 11 | 000 |
| 13 | 001 |
| 14 | 010 |
| 4 | 0110 0 |
| 8 | 0110 1 |
| 0 | 0111 0 |
| 6 | 0111 1 |
| 15 | 10 |
| 9 | 1100 0 |
| 3 | 1100 1 |
| 5 | 1101 0 |
| 10 | 1101 1 |
| 12 | 1110 0 |
| 1 | 1110 10 |
| 2 | 1110 11 |
| 7 | 1111 |

Table 3(a)–Table 3(d) show a portion of the lookup tables established for the first four algorithms in Table 2 in the first round of lookup. If the "Done" column equals 1, this implies that SE may be decoded and the value is listed in the "Data" column; otherwise, a next lookup is required, and the initial index for next lookup (value is not shown) is listed in the "Data" column.

TABLE 3(a)

| FL, F = 1 | | |
|---|---|---|
| Index | Done | Data |
| 0 | 0 | ... |
| 1 | 0 | ... |
| ... | ... | ... |
| ... | ... | ... |

TABLE 3(b)

| Index | Done | Data |
|---|---|---|
| \multicolumn{3}{c}{FL, F = 2} | | |

| Index | Done | Data |
|---|---|---|
| 0 | 0 | ... |
| 1 | 0 | ... |
| 2 | 1 | 15 |
| 3 | 0 | ... |
| ... | ... | ... |
| ... | ... | ... |

TABLE 3(c)

FL, F = 3

| Index | Done | Data |
|---|---|---|
| 0 | 0 | 11 |
| 1 | 1 | 13 |
| 2 | 1 | 14 |
| 3 | 0 | ... |
| 4 | 1 | 15 |
| 5 | 1 | 15 |
| 6 | 0 | ... |
| 7 | 0 | ... |
| ... | ... | ... |
| ... | ... | ... |

TABLE 3(d)

FL, F = 4

| Index | Done | Data |
|---|---|---|
| 0 | 1 | 11 |
| 1 | 1 | 11 |
| 2 | 1 | 13 |
| 3 | 1 | 13 |
| 4 | 1 | 14 |
| 5 | 1 | 14 |
| 6 | 0 | ... |
| 7 | 0 | ... |
| 8 | 1 | 15 |
| 9 | 1 | 15 |
| 10 | 1 | 15 |
| 11 | 1 | 15 |
| 12 | 0 | ... |
| 13 | 0 | ... |
| 14 | 0 | ... |
| 15 | 1 | 7 |
| ... | ... | ... |

After one round of lookup table establishment, the bits consumed (denoted by letters with gray background as indicated in Table 2(a)~Table 2(f)) that have been used for establishing lookup table will be removed. Thus, 0 or several sub VLC tables may be established after one round of lookup table establishment. If the number of sub VLC tables equals 0, this means that the lookup table establishment is completed; otherwise, the next round of lookup table establishment is executed on the sub VLC tables. The sub VLC tables generated from Table 2(a)~Table 2(f) after the first round are respectively illustrated in Table 4(a)~Table 4(f) below.

Table 4(f) does not have any sub VLC table. This implies that the fixed length decoding algorithm with F=6 establishes lookup tables in one round. Fixed length decoding algorithms with F=1~5 need the next round.

TABLE 4(a)

FL, F = 1

| SE | Code |
|---|---|
| 11 | 00 |
| 13 | 01 |
| 14 | 10 |
| 4 | 110 0 |
| 8 | 110 1 |
| 0 | 111 0 |
| 6 | 111 1 |
| 15 | 0 |
| 9 | 100 0 |
| 3 | 100 1 |
| 5 | 101 0 |
| 10 | 101 1 |
| 12 | 110 0 |
| 1 | 110 10 |
| 2 | 110 11 |
| 7 | 111 |

TABLE 4(b)

FL, F = 2

| SE | Code |
|---|---|
| 11 | 0 |
| 13 | 1 |
| 14 | 0 |
| 4 | 10 0 |
| 8 | 10 1 |
| 0 | 11 0 |
| 6 | 11 1 |
| 15 |  |
| 9 | 00 0 |
| 3 | 00 1 |
| 5 | 01 0 |
| 10 | 01 1 |
| 12 | 10 0 |
| 1 | 10 10 |
| 2 | 10 11 |
| 7 | 11 |

TABLE 4(c)

| FL, F = 3 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 00 |
| 3 | 01 |
| 5 | 10 |
| 10 | 11 |
| 12 | 00 |
| 1 | 010 |
| 2 | 011 |
| 7 | 1 |

TABLE 4(d)

| FL, F = 4 | |
|---|---|
| SE | Code |
| 11 | |
| 13 | |
| 14 | |
| 4 | 0 |
| 8 | 1 |
| 0 | 0 |
| 6 | 1 |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 4(e)

| FL, F = 5 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | 0 |
| 2 | 1 |
| 7 | |

TABLE 4(f)

| FL, F = 6 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | |
| 2 | |
| 7 | |

A blank region in the "Code" column refers that these codes are released after the first round of lookup table establishment. In other words, lookup table for these codes is established after the first round, so they do not belong to any sub VLC table and are not denoted with any colors (shading) but have normal fonts. Respective sub VLC tables are denoted and separated by different fill colors (shading) and different fonts. Let Table 4(b) be taken for example. From top to down, the first sub VLC table (including SE=11 and SE=13) is denoted in bold letters with fill color; the second sub VLC table (including SE=14, SE=4, SE=8, SE=0 and SE=6) is denoted in italic letters without fill color; the third sub VLC table (including SE=9, SE=3, SE=5, SE=10, SE=12, SE=1, SE=2 and SE=7) is denoted in bold letters with fill color. All codes in a VLC table or in a sub VLC table must be different each other. The number of the sub VLC tables generated after the first round depends on the algorithm selected and the original VLC table. If the number of sub VLC table equals 0 as indicated in Table 4(f), this implies that the lookup table establishment is completed; otherwise, based on sub VLC tables, a lookup table for the next round is established.

In a bit stream, what follows a valid code may be another valid code or a combination of other bits. The number of bits that is looked up by the fixed length decoding algorithm is equal to its fixed length F (N=F). Suppose the fixed length equals F and it tries to decode N=F bit(s). If N is equal to or larger than the code length of the valid code, this implies that the valid code is decoded; otherwise, the remaining codes of the valid code become a valid code in a next round. Let Table 2(b) be taken for example. Suppose F=2, smaller than the code length of the codes "001" and "010". Thus, the lookup table for those codes is not completely established now, and the remaining codes "1" and "0" are left to be established in the next round. The code length of the valid code "10" equals 2 and F=2. Thus, the lookup table for valid code "10" is established and its SE=15, and there is no need for another round.

According to the fixed length decoding algorithm, the required lookup table size for each lookup, exemplarily but not restrictively, is equal to $2^F$, and a large lookup table size implies that much hardware resources are required. Let Table 3(a)~Table 3(d) be taken for example. When F=1, the index numbers include 0 and 1, which are both smaller than the length of the valid code, so no code is decoded. When F=2, the index numbers include 0, 1, 2, 3, and SE=15 is decoded from index 2. When F=3, the index numbers include 0~7, and SE=11, 13, 14, 15 and 15 are decoded from index 0, 1, 2, 4, 5. When F=4, the index numbers include 0~15, and SE=11, 11, 13, 13, 14, 14, 15, 15, 15, 15, 7 are decoded from indexes 0, 1, 2, 3, 4, 5, 8, 9, 10, 11, 15. As the lookup length (F) becomes larger, more codes are decoded but the required lookup table is larger as well. As indicated in Table 3, if F of the first lookup equals 1, 2, 3, 4, then 0, 1, 4, 5 codes are looked up respectively, but the lookup table respectively requires 2, 4, 8, 16 indexes. As for how many codes are decoded and how many entries are required in the second lookup, this depends on the lengths of the remaining codes and the lookup length.

Suppose algorithm FL with F=1 is selected to establish the VLC lookup table for the first round, Table 4(a) will be used to generate the second round lookup table. Then, after a lookup table is generated in the second round, the possible sub VLC table sets are such as Table 5(a)~Table 5(t). In Table 5, "F=N/M" (N and M are positive integers) denotes that the first sub VLC table of Table 4(a) is established with fixed length N, and the second sub VLC table of Table 4(a) is established with fixed length M.

As disclosed above, the first round may generate 6 sub VLC table sets; and 20 sub VLC table sets may further be generated if the first sub VLC table set in the 6 sub VLC table sets is selected in the second round of lookup table establishment. Be aware that each sub VLC table set includes one sub VLC table or more. Based on these sub VLC table sets, the present embodiment of the disclosure establishes lookup tables adapted to system requirements.

TABLE 5(a)

| F = 1/1 | |
|---|---|
| SE | Code |
| 11 | 0 |
| 13 | 1 |
| 14 | 0 |
| 4 | 10 0 |
| 8 | 10 1 |
| 0 | 11 0 |
| 6 | 11 1 |
| 15 | |
| 9 | 00 0 |
| 3 | 00 1 |
| 5 | 01 0 |
| 10 | 01 1 |
| 12 | 10 0 |
| 1 | 10 10 |
| 2 | 10 11 |
| 7 | 11 |

TABLE 5(b)

| F = 1/2 | |
|---|---|
| SE | Code |
| 11 | 0 |
| 13 | 1 |
| 14 | 0 |
| 4 | 10 0 |
| 8 | 10 1 |
| 0 | 11 0 |
| 6 | 11 1 |
| 15 | |
| 9 | 00 |
| 3 | 01 |
| 5 | 10 |
| 10 | 11 |
| 12 | 00 |
| 1 | 010 |
| 2 | 011 |
| 7 | 1 |

TABLE 5(c)

| F = 1/3 | |
|---|---|
| SE | Code |
| 11 | 0 |
| 13 | 1 |
| 14 | 0 |
| 4 | 10 0 |
| 8 | 10 1 |
| 0 | 11 0 |
| 6 | 11 1 |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 5(d)

| F = 1/4 | |
|---|---|
| SE | Code |
| 11 | 0 |
| 13 | 1 |
| 14 | 0 |
| 4 | 10 0 |
| 8 | 10 1 |
| 0 | 11 0 |
| 6 | 11 1 |
| 15 | |
| 9 | |
| 3 | |
| 5 | |
| 10 | |
| 12 | |
| 1 | 0 |
| 2 | 1 |
| 7 | |

TABLE 5(e)

| F = 1/5 | |
|---|---|
| SE | Code |
| 11 | 0 |
| 13 | 1 |
| 14 | 0 |
| 4 | 10 0 |
| 8 | 10 1 |
| 0 | 11 0 |
| 6 | 11 1 |
| 15 | |
| 9 | |
| 3 | |
| 5 | |
| 10 | |
| 12 | |
| 1 | |
| 2 | |
| 7 | |

TABLE 5(f)

| F = 2/1 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 000 |
| 3 | 001 |
| 5 | 010 |
| 10 | 011 |
| 12 | 100 |
| 1 | 1010 |
| 2 | 1011 |
| 7 | 11 |

TABLE 5(g)

| F = 2/2 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 00 |
| 3 | 01 |
| 5 | 10 |
| 10 | 11 |
| 12 | 00 |
| 1 | 010 |
| 2 | 011 |
| 7 | 1 |

TABLE 5(h)

| F = 2/3 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 5(f)

| F = 2/1 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 000 |
| 3 | 001 |
| 5 | 010 |
| 10 | 011 |
| 12 | 100 |
| 1 | 1010 |
| 2 | 1011 |
| 7 | 11 |

TABLE 5(g)

| F = 2/2 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 00 |
| 3 | 01 |
| 5 | 10 |
| 10 | 11 |
| 12 | 00 |
| 1 | 010 |
| 2 | 011 |
| 7 | 1 |

TABLE 5(h)

| F = 2/3 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 5(i)

| F = 2/4 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | |
| 3 | |
| 5 | |
| 10 | |
| 12 | |
| 1 | 0 |
| 2 | 1 |
| 7 | |

TABLE 5(j)

| F = 2/5 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | |
| 3 | |
| 5 | |
| 10 | |
| 12 | |
| 1 | |
| 2 | |
| 7 | |

TABLE 5(k)

| F = 2/1 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 000 |
| 3 | 001 |
| 5 | 010 |
| 10 | 011 |
| 12 | 100 |
| 1 | 1010 |
| 2 | 1011 |
| 7 | 11 |

TABLE 5(l)

| F = 2/2 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 00 |
| 3 | 01 |
| 5 | 10 |
| 10 | 11 |
| 12 | 00 |
| 1 | 010 |
| 2 | 011 |
| 7 | 1 |

TABLE 5(m)

| F = 2/3 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 5(n)

| F = 2/4 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | |
| 3 | |
| 5 | |
| 10 | |
| 12 | |
| 1 | 0 |
| 2 | 1 |
| 7 | |

TABLE 5(o)

| F = 2/5 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | |
| 3 | |
| 5 | |
| 10 | |
| 12 | |
| 1 | |
| 2 | |
| 7 | |

TABLE 5(p)

| F = 2/1 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 000 |
| 3 | 001 |
| 5 | 010 |
| 10 | 011 |
| 12 | 100 |
| 1 | 1010 |
| 2 | 1011 |
| 7 | 11 |

TABLE 5(q)

| F = 2/2 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 00 |
| 3 | 01 |
| 5 | 10 |
| 10 | 11 |
| 12 | 00 |
| 1 | 010 |
| 2 | 011 |
| 7 | 1 |

TABLE 5(r)

| F = 2/3 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 0 |
| 3 | 1 |
| 5 | 0 |
| 10 | 1 |
| 12 | 0 |
| 1 | 10 |
| 2 | 11 |
| 7 | |

Table 5(s)

| F = 2/4 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | |
| 3 | |
| 5 | |
| 10 | |
| 12 | |
| 1 | 0 |
| 2 | 1 |
| 7 | |

TABLE 5(t)

| F = 2/5 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | |
| 3 | |
| 5 | |
| 10 | |
| 12 | |
| 1 | |
| 2 | |
| 7 | |

Suppose, after the second round of generating the lookup table, Table 5(a) is selected to establish the VLC lookup table. Then, after a lookup table is generated in the third round, the possible sub VLC table sets are such as Table 6(a)~Table 6(I). In Table 6, F=L/N/M (L, N and M are positive integers) denotes that the first sub VLC table of Table 5(a) is established with fixed length L, the second sub VLC table of Table 5(a) is established with fixed length N, and the third sub VLC table of Table 5(a) is established with fixed length M.

TABLE 6(a)

| F = 1/1/1 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 00 |
| 3 | 01 |
| 5 | 10 |
| 10 | 11 |
| 12 | 00 |
| 1 | 010 |
| 2 | 011 |
| 7 | 1 |

TABLE 6(b)

| F = 1/1/2 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 6(c)

| F = 1/2/1 | |
|---|---|
| SE | Code |
| 11 | |
| 13 | |
| 14 | |
| 4 | 0 |
| 8 | 1 |
| 0 | 0 |
| 6 | 1 |
| 15 | |
| 9 | 00 |
| 3 | 01 |
| 5 | 10 |
| 10 | 11 |
| 12 | 00 |
| 1 | 010 |
| 2 | 011 |
| 7 | 1 |

TABLE 6(d)

| F = 1/2/2 | |
|---|---|
| SE | Code |
| 11 | |
| 13 | |
| 14 | |
| 4 | 0 |
| 8 | 1 |
| 0 | 0 |
| 6 | 1 |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 6(e)

| F = 1/3/1 | |
|---|---|
| SE | Code |
| 11 | |
| 13 | |
| 14 | |
| 4 | |
| 8 | |
| 0 | |
| 6 | |
| 15 | |
| 9 | 00 |
| 3 | 01 |
| 5 | 10 |
| 10 | 11 |
| 12 | 00 |
| 1 | 010 |
| 2 | 011 |
| 7 | 1 |

TABLE 6(f)

| F = 1/3/2 | |
|---|---|
| SE | Code |
| 11 | |
| 13 | |
| 14 | |
| 4 | |
| 8 | |
| 0 | |
| 6 | |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 6(g)

| F = 1/1/3 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | |
| 3 | |
| 5 | |
| 10 | |
| 12 | |
| 1 | 0 |
| 2 | 1 |
| 7 | |

TABLE 6(h)

| F = 1/1/4 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | |
| 3 | |
| 5 | |
| 10 | |
| 12 | |
| 1 | |
| 2 | |
| 7 | |

TABLE 6(i)

| F = 1/2/3 | |
|---|---|
| SE | Code |
| 11 | |
| 13 | |
| 14 | |
| 4 | 0 |
| 8 | 1 |
| 0 | 0 |
| 6 | 1 |
| 15 | |
| 9 | |
| 3 | |
| 5 | |
| 10 | |
| 12 | |
| 1 | 0 |
| 2 | 1 |
| 7 | |

TABLE 6(j)

| F = 1/2/4 | |
|---|---|
| SE | Code |
| 11 | |
| 13 | |
| 14 | |
| 4 | 0 |
| 8 | 1 |
| 0 | 0 |
| 6 | 1 |
| 15 | |
| 9 | |
| 3 | |
| 5 | |
| 10 | |
| 12 | |
| 1 | |
| 2 | |
| 7 | |

TABLE 6(l)

| F = 1/3/4 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | |
| 2 | |
| 7 | |

Suppose, after the third round of the lookup table establishment, Table 6(a) is selected to establish the VLC lookup table. Then, after a VLC lookup table is generated in the fourth round, the possible sub VLC table sets are such as Table 7(a)~Table 7(I). In Table 7, F=L/N/M (L, N and M are positive integers) denotes that the first sub VLC table of Table 6(a) is established with fixed length L, the second sub VLC table of Table 6(a) is established with fixed length N, and the third sub VLC table of Table 6(a) is established with fixed length M.

TABLE 6(k)

| F = 1/3/3 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | 0 |
| 2 | 1 |
| 7 | |

TABLE 7(a)

| F = 1/1/1 | |
|---|---|
| SE | Code |
| 11 | |
| 13 | |
| 14 | |
| 4 | 0 |
| 8 | 1 |
| 0 | 0 |
| 6 | 1 |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 7(b)

| F = 1/1/2 ||
|---|---|
| SE | Code |
| 11 | |
| 13 | |
| 14 | |
| 4 | 0 |
| 8 | 1 |
| 0 | 0 |
| 6 | 1 |
| 15 | |
| 9 | 0 |
| 3 | 1 |
| 5 | 0 |
| 10 | 1 |
| 12 | |
| 1 | 0 |
| 2 | 1 |
| 7 | |

TABLE 7(d)

| F = 1/2/1 ||
|---|---|
| SE | Code |
| 11 | |
| 13 | |
| 14 | |
| 4 | 0 |
| 8 | 1 |
| 0 | 0 |
| 6 | 1 |
| 15 | |
| 9 | |
| 3 | |
| 5 | |
| 10 | |
| 12 | 0 |
| 1 | 10 |
| 2 | 11 |
| 7 | |

TABLE 7(c)

| F = 1/1/3 ||
|---|---|
| SE | Code |
| 11 | |
| 13 | |
| 14 | |
| 4 | 0 |
| 8 | 1 |
| 0 | 0 |
| 6 | 1 |
| 15 | |
| 9 | 0 |
| 3 | 1 |
| 5 | 0 |
| 10 | 1 |
| 12 | |
| 1 | |
| 2 | |
| 7 | |

TABLE 7(e)

| F = 1/2/2 ||
|---|---|
| SE | Code |
| 11 | |
| 13 | |
| 14 | |
| 4 | 0 |
| 8 | 1 |
| 0 | 0 |
| 6 | 1 |
| 15 | |
| 9 | |
| 3 | |
| 5 | |
| 10 | |
| 12 | |
| 1 | 0 |
| 2 | 1 |
| 7 | |

TABLE 7(f)

| F = 1/2/3 | |
|---|---|
| SE | Code |
| 11 | |
| 13 | |
| 14 | |
| 4 | 0 |
| 8 | 1 |
| 0 | 0 |
| 6 | 1 |
| 15 | |
| 9 | |
| 3 | |
| 5 | |
| 10 | |
| 12 | |
| 1 | |
| 2 | |
| 7 | |

TABLE 7(h)

| F = 2/1/2 | |
|---|---|
| SE | Code |
| 11 | |
| 13 | |
| 14 | |
| 4 | |
| 8 | |
| 0 | |
| 6 | |
| 15 | |
| 9 | 0 |
| 3 | 1 |
| 5 | 0 |
| 10 | 1 |
| 12 | |
| 1 | 0 |
| 2 | 1 |
| 7 | |

TABLE 7(g)

| F = 2/1/1 | |
|---|---|
| SE | Code |
| 11 | |
| 13 | |
| 14 | |
| 4 | |
| 8 | |
| 0 | |
| 6 | |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 7(i)

| F = 2/1/3 | |
|---|---|
| SE | Code |
| 11 | |
| 13 | |
| 14 | |
| 4 | |
| 8 | |
| 0 | |
| 6 | |
| 15 | |
| 9 | 0 |
| 3 | 1 |
| 5 | 0 |
| 10 | 1 |
| 12 | |
| 1 | |
| 2 | |
| 7 | |

TABLE 7(j)

| F = 2/2/1 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | 0 |
| 1 | 10 |
| 2 | 11 |
| 7 | |

TABLE 7(k)

| F = 2/2/2 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | 0 |
| 2 | 1 |
| 7 | |

TABLE 7(l)

| F = 2/2/3 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | |
| 2 | |
| 7 | |

Suppose, after a lookup table is generated in the fourth round, Table 7(a) is selected to establish the VLC lookup table. Then, after a VLC lookup table is generated in the fifth round, the possible sub VLC table sets are such as Table 8(a)~Table 8(b). Suppose, after a lookup table is generated in the fifth round, Table 8(a) is selected to establish the VLC lookup table. Then, after a lookup table is generated in the sixth round, Table 8(c) is obtained which contains no sub VLC table. Also note that not every lookup table applicable to the VLC table in Table 1 requires many rounds in table establishment. The number of rounds required in table establishment depends on the original VLC table and the algorithm selected for table establishment. For example, if the first round of lookup table establishment adopts the fixed length decoding algorithm with fixed length 6, then only one table establishing procedure is needed as indicated in Table 4(f).

TABLE 8(a)

| F = 1/1/1/1/1 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | 0 |
| 2 | 1 |
| 7 | |

TABLE 8(b)

| F = 1/1/1/1/2 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | |
| 2 | |
| 7 | |

TABLE 8(c)

| F = 1 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | |
| 2 | |
| 7 | |

In addition, the same VLC table can be established to various lookup tables. As disclosed above, 6 lookup tables are exemplified in the first round of lookup table establishment as indicated in Table 2(a)~Table 2(f). If the leading bit decoding algorithm or a mixture of various algorithms is adopted, the present embodiment of the disclosure may use more possible lookup table establishment algorithms. Since there are various lookup tables available for selection, the present embodiment of the disclosure may determine which lookup table is conformed to the system environment (the current free system resource) and the target decoding rate so as to automatically and dynamically establish lookup tables conformed to system requirements.

The present embodiment of the disclosure dynamically generates lookup tables applicable to the system environment, even if the free system memory space and/or system work load vary with the software in application, and vary in response to the number of application software executed at the same time.

FIG. 1 shows an operation flowchart of the embodiment of the present disclosure. At step 110, an original VLC table is received. At step 120, the original VLC table is sorted to form a new VLC table. For example, the code values in the original VLC table is sorted in an ascending order to form a new VLC table (abbreviated as VLC table, and Table 1 is already a sorted VLC table). At step 130, an adaption function is executed according to the system memory resource (such as the index upper limit $I_1$ of the lookup table) and the target lookup rate (the lowest decoding rate $D_1$ in each lookup) so as to dynamically establish a system adaptive lookup table. The details of step 130 are further exemplified below. The adaption parameters required by the adaption function are dynamically generated according to the free system memory resource and/or the target decoding rate and/or the system work load. The size of the lookup table generated by various lookup table establishment algorithms and the possible decoding rates thereof are estimated. The estimates are applied to the adaption function to obtain respective scores (T) of the various lookup table establishment algorithms. An adaptive lookup table may be dynamically established by selecting the lookup table establishment algorithm with the smallest or the largest score. To select the algorithm with the smallest score or the largest score depends on the adaption function.

In the present embodiment of the disclosure, the lookup table applicable to system requirements is dynamically generated according to two parameters: the current largest free memory resource index $I_1$ and the target lookup decoding rate (the lowest target decoding rate $D_1$ of each lookup). Furthermore, if the current system work load varies, the target lookup decoding rate $D_1$ may be affected.

Figure 2:
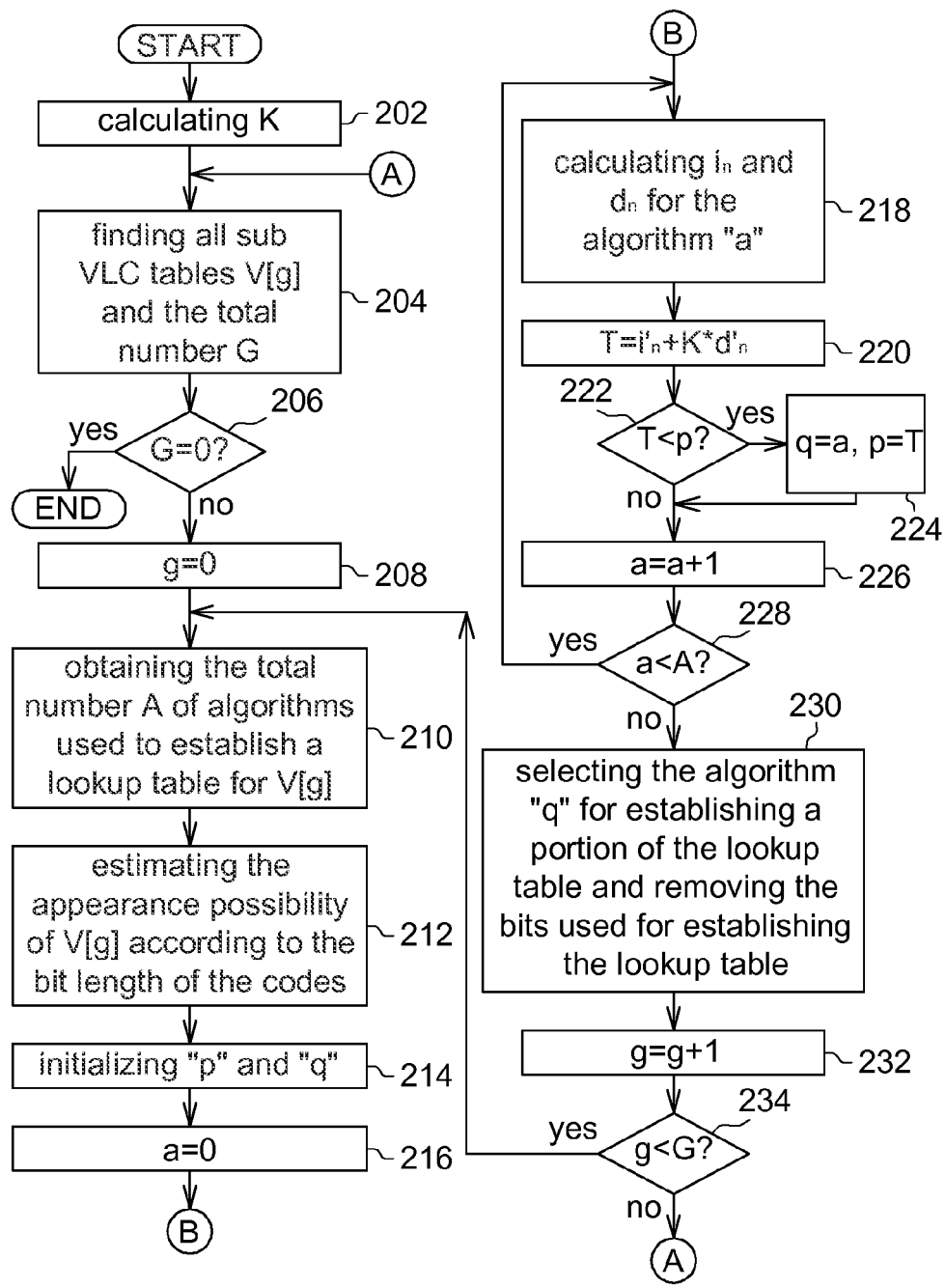
FIG. 2 shows how an adaptive lookup table is established according to the embodiment of the present disclosure.

How the present embodiment of the disclosure establishes the adaptive lookup table is exemplified below. Referring to FIG. 2. In step 202, an adaption parameter $K=\{(I_1 * 2^{(-LCL)})/D_1\}$ is calculated, wherein LCL denotes the bit length of the longest code of the VLC table or the sub VLC table. According to the definition of K, when the size of the free system memory resource varies, $I_1$ may vary and therefore K may also vary. When the system work load varies, $D_1$ may vary and therefore K may also vary. In the present embodiment of the disclosure, when the size of the free system memory resource and/or the system work load varies, K may vary and so are the content and/or the size of the dynamic VLC decoder lookup table.

In step 204, the sub VLC tables (denoted as V[g]) are found and a total number G of the sub VLC tables is found. In the first round of lookup table establishment, the sorted VLC table is regarded as a sub VLC table, so the total number G of sub VLC tables (denoted as V[g]) equals 1. For convenience of elaboration, the sub VLC table referred herein below includes the sorted VLC table.

After the first round, the bits that have been used for establishing the lookup table are removed, and no codes or a few remaining codes are left. If there are no codes left, this implies that the lookup table for the corresponding sub VLC table or VLC table is completed; otherwise, a number of smaller VLC tables, i.e. the sub VLC tables, will be established. The sub VLC tables are independent, and respective lookup table must be established for each sub VLC table.

In step 206, whether G=0 is determined. If G=0, then the process ends, otherwise the process proceeds to step 208. In step 208, g is set as 0. In greater details, subsequent steps are performed to the sub VLC tables V[g] from g=0. In step 210, the total number A of algorithms that are applicable to establish lookup table for the sub VLC tables V[g] is obtained. Let the above elaboration be taken for example. The sorted VLC table is as indicated in Table 1. Suppose the fixed length (FL) decoding algorithm is selected for the first round lookup table establishment. Then, exemplarily but not restrictively, 6 lookup algorithms (F=1~F=6) are available in total, that is, A=6. Suppose the lookup table establishing algorithm with (FL,F=1) is selected, the sub VLC table set, which includes the remaining VLC codes after the first round lookup table is established, includes 2 independent sub VLC tables (G=2), as indicated in Table 4(a).

There are many algorithms available for establishing lookup table for the VLC table or the sub VLC table. As for the fixed length decoding algorithm, the total number of possible algorithms relates to the possible range of F. For the VLC table of Table 1, the longest code has 6 bits, so the possible F values range between 1~6, and there are 6 lookup table establishing algorithms available. If the longest code of the VLC table has 8 bits, then the possible F values range between 1~8, and there are 8 lookup table establishing algorithms available. For convenience, the lookup table establishing algorithms are denoted by numbers. In the above examples, (FL,F=1)~(FL,F=6) respectively denote algorithm 0 to algorithm 5.

In step 212, the appearance possibility is estimated according to the length of the codes in the sub VLC table. The meanings of appearance possibility and the decoding rate are interpreted below.

The decoding rate refers to the ratio of the estimated number of decodable codes to the number of total codes, which is based on two assumptions as follows. The number of VLC codes in a bit string is unlimited (therefore, the appearance probability of the total code is always 1.0); and two VLC codes having the same bit length have the same appearance possibility. The VLC codes are generated according to the appearance possibility of SE. Short code is assigned to the SE with high appearance possibility, and long code is assigned to the SE with low appearance possibility. In theory, VLC codes in the same bit length should have the same appearance possibility of $1/2^n$, wherein n is a positive integer, which denotes the length of the code. In practical application, the appearance possibilities of those VLC codes with length n are not always equal to $1/2^n$. The decoder may not know the actual appearance possibility and accordingly the appearance possibility is estimated according to the second assumption. Based on the above assumptions, the appearance possibility for a 1-bit code (n=1), a 2-bit code (n=2), and a 3-bit code (n=3) are respectively estimated as: $1/2^1=0.5$, $1/2^2=0.25$, and $1/2^3=0.125$, and so on. If one 1-bit code and two 3-bit codes are decoded during VLC decoding, i.e. the lookup table for one 1-bit code and two 3 bit codes are established during lookup table establishment, then the decoding rate for this lookup is expressed as: 1*0.5+2*0.125=0.75.

In step 214, q and p are initialized as 0 and a maximum respectively. In step 216, let a=0. In step 218, the required lookup table size $i_n$ for the lookup table establishment algorithm "a" and the decoding rate $d_n$ of the algorithm "a" are calculated. The lookup table size required by the fixed length lookup algorithm is, exemplarily but not restrictively, equal to the power of 2. For example, if the lookup table is established with fixed length decoding algorithm (FL,F=2), then the lookup table size is equal to $2^2=4$. If the lookup table is established with fixed length decoding algorithm (FL,F=6), then the lookup table size is equal to $2^6=64$. How the decoding rate d is calculated according to the appearance possibility has been disclosed above. The lookup table size index $i_n$ may be regarded as be related to the appearance possibility.

In step 220, $T=i'_n+K*d'_n$, wherein $i'_n=i_n/2^{(LCL)}$ and $d'_n=1-d_n$. In step 222, whether T is smaller than the smallest score p is determined. If T is smaller than p, then the process proceeds to step 224, q and p are respectively set as q=a, p=T. That is, in the present embodiment of the disclosure, the lookup table establishment algorithm "q" may be adopted because this algorithm "q" has the smallest T. However, the present disclosure is not limited thereto. Also, in step 214, after p is initialized as a maximum, if T is smaller than p, then p may be updated as p=T.

Otherwise, if T is not smaller than p, then the process proceeds to step 226, a=a+1 to estimate T for next algorithm. In step 228, whether "a" is larger than "A" is determined (this is to determine whether T of the possible lookup algorithms have been calculated). In step 230, the algorithm "q" is selected for establishing a portion of the lookup table (exemplarily but not restrictively, T of the algorithm "q" is the smallest) and the bits used in establishing lookup table (that is, the bits in letters with gray background as indicated in Table 2(a)~Table 2(f)) are removed to generate a sub VLC table (such as the sub VLC tables of Table 4(a)~Table 4(f)). Thus, the lookup table for the sub VLC table (or VLC table) V[g] is established. In step 232, g=g+1, and the above steps are repeated for establishing the lookup table of the sub VLC table V[g+1]. In step 234, whether g is smaller than G is determined. If yes, that means the lookup tables of the sub VLC tables have not completed, and the process returns to step 210; otherwise, the process returns to step 204 to get new sub VLC tables V[g] and new total number of sub VLC tables, G.

Table 9(a) is an original VLC table. Given that $I_1=20$, $D_1=0.65$, then the adaption parameter K will equal to 0.48. The, respective T values for the algorithms with fixed length 1~6 are estimated. $T_1$ denotes the T value for the fixed length decoding algorithm with fixed length 1, $T_2$ denotes the T value of the fixed length decoding algorithm with fixed length 2 and so on. In Table 9(b), $i'_1$ and $d'_1$ respectively equal 0.03125 ($2/2^6$) and 1.00 (1−0.0), therefore $T_1=i'_1+K*d'_1=0.51125$. In Table 9(c), $i'_2$ and $d'_2$ respectively equal 0.0625 ($4/2^6$) and 0.75 (1−0.25), therefore $T_2=i'_2+K*d'_2=0.4225$. In Table 9(d), $i'_3$ and $d'_3$ respectively equal 0.125 ($8/2^6$) and 0.375 (1−(0.25+3×0.125)), therefore $T_3=i'_3+K*d'_3=0.375$. In Table 9(e), $i'_4$ and $d'_4$ respectively equal 0.25 ($16/2^6$) and 0.3125 (1−(0.25+3×0.125+0.0625)), therefore $T_4=i'_4+K*d'_4=0.4$. In Table 9(f), $i'_5$ and $d'_5$ respectively equal 0.50 ($32/2^6$) and 0.03125 (1−(0.25+3×0.125+0.0625+9×0.03125)), therefore $T_5=i'_5+K*d'_5=0.515$. In Table 9(g), $i'_6$ and $d'_6$ respectively equal 1.00 ($64/2^6$) and 0.00 (1−(0.25+3×0.125+0.0625+9×0.03125+2×0.015625)), therefore $T_6=i'_6+K*d'_6=1.00$. $T_1$-$T_6$ respectively equal 0.51125, 0.4225, 0.375, 0.4, 0.515 and 1.00. It is known from Table 9(a)~10 (g) that $T_3$ (0.375) is the smallest and therefore the present embodiment of the disclosure, exemplarily but not restrictively, selects the fixed length decoding algorithm with fixed length 3 in the round for establishing the lookup table.

TABLE 9(a)

| Sorted VLC | |
|---|---|
| SE | Code |
| 11 | 000 |
| 13 | 001 |
| 14 | 010 |
| 4 | 0110 0 |
| 8 | 0110 1 |
| 0 | 0111 0 |
| 6 | 0111 1 |
| 15 | 10 |
| 9 | 1100 0 |
| 3 | 1100 1 |
| 5 | 1101 0 |
| 10 | 1101 1 |
| 12 | 1110 0 |
| 1 | 1110 10 |
| 2 | 1110 11 |
| 7 | 1111 |

TABLE 9(b)

| FL, F = 1 | |
|---|---|
| SE | Code |
| 11 | 00 |
| 13 | 01 |
| 14 | 10 |
| 4 | 110 0 |
| 8 | 110 1 |
| 0 | 111 0 |
| 6 | 111 1 |
| 15 | 0 |
| 9 | 100 0 |
| 3 | 100 1 |
| 5 | 101 0 |
| 10 | 101 1 |
| 12 | 110 0 |
| 1 | 110 10 |
| 2 | 110 11 |
| 7 | 111 |

TABLE 9(c)

| FL, F = 2 | |
|---|---|
| SE | Code |
| 11 | 0 |
| 13 | 1 |
| 14 | 0 |
| 4 | 10 0 |
| 8 | 10 1 |
| 0 | 11 0 |
| 6 | 11 1 |
| 15 | |
| 9 | 00 0 |
| 3 | 00 1 |
| 5 | 01 0 |
| 10 | 01 1 |
| 12 | 10 0 |
| 1 | 10 10 |
| 2 | 10 11 |
| 7 | 11 |

TABLE 9(d)

| FL, F = 3 | |
|---|---|
| SE | Code |
| 11 | |
| 13 | |
| 14 | |
| 4 | 00 |
| 8 | 01 |
| 0 | 10 |
| 6 | 11 |
| 15 | |
| 9 | 00 |
| 3 | 01 |
| 5 | 10 |
| 10 | 11 |
| 12 | 00 |
| 1 | 010 |
| 2 | 011 |
| 7 | 1 |

TABLE 9(e)

| FL, F = 4 | |
|---|---|
| SE | Code |
| 11 | |
| 13 | |
| 14 | |
| 4 | 0 |
| 8 | 1 |
| 0 | 0 |
| 6 | 1 |
| 15 | |
| 9 | 0 |
| 3 | 1 |
| 5 | 0 |
| 10 | 1 |
| 12 | 0 |
| 1 | 10 |
| 2 | 11 |
| 7 | |

TABLE 9(f)

| FL, F = 5 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | 0 |
| 2 | 1 |
| 7 | |

TABLE 9(g)

| FL, F = 6 | |
|---|---|
| SE | Code |
| 11 | |
| 13 | |
| 14 | |
| 4 | |
| 8 | |
| 0 | |
| 6 | |
| 15 | |
| 9 | |
| 3 | |
| 5 | |
| 10 | |
| 12 | |
| 1 | |
| 2 | |
| 7 | |

Second Embodiment

In the second embodiment, the leading bit decoding algorithm is used for establishing lookup table. The leading bit of the leading bit decoding algorithm may flexibly equal 0 or 1. In decoding VLC codes, the lookup table may be generated by the same algorithm or by a combination of different algorithms.

As disclosed above, when a fixed length decoding algorithm with fixed length F is selected to decode, exemplarily but not restrictively, F bits are taken from a bit stream for lookup. However, the number of bits that is looked up by the leading bit decoding algorithm depends on the number of effective leading bits in the bit stream. According to the leading bit decoding algorithm, the largest length of leading bits M is set so as to avoid decoding the subsequent valid VLC codes. Suppose the number of the effective leading bits in the bit stream is L, and the number of bits that is look up by the leading bit decoding algorithm is N. When decoding the VLC codes, if L is larger than or is equal to M, then N=M; otherwise, N=L+1. If N is equal to the length of the valid code, this means that the code is decoded; otherwise, the remaining codes become the valid code of the next lookup. The leading bit may flexibly be 0 (leading bit 0, L0) or 1 (leading bit 1, L1).

Let leading bit 0 and M=3 be taken for example. The L values of the VLC codes "000", "001", "010" of Table 1 respectively equal 3, 2, 1, provided that there are no subsequent bits. Thus, N respectively equals 3, 3, 2. Since the first two N values are equal to the length of the corresponding code, SE of the codes "000" and "001" are decoded as 11 and 13 respectively. Since the last N value is smaller than the length of the corresponding code, the remaining code of "010" is "0", which becomes a valid code for the next round of lookup. As indicated in Table 10 (a), the bits with gray background may be looked up by the algorithm with leading bit 0 and M=3 in the first round. Table 10 (b) is the first round of lookup table established by the algorithm with leading bit 0 and M=3.

TABLE 10 (a)

| SE | Code | L0 Max = 3 |
|---|---|---|
| 11 | 000 | |
| 13 | 001 | |
| 14 | 010 | |
| 4 | 0110 0 | |
| 8 | 0110 1 | |
| 0 | 0111 0 | |
| 6 | 0111 1 | |
| 15 | 10 | |
| 9 | 1100 0 | |
| 3 | 1100 1 | |
| 5 | 1101 0 | |
| 10 | 1101 1 | |
| 12 | 1110 0 | |
| 1 | 1110 10 | |
| 2 | 1110 11 | |
| 7 | 1111 | |

TABLE 10 (b)

| L0, Max = 3 | | |
|---|---|---|
| Index | Done | Data |
| 0 | 0 | ... |
| 1 | 1 | ... |
| 2 | 1 | 13 |
| 3 | 1 | 11 |
| ... | ... | ... |
| ... | ... | ... |

TABLE 11 (a)

| SE | Code | L1, Max = 4 |
|---|---|---|
| 11 | 000 | |
| 13 | 001 | |
| 14 | 010 | |
| 4 | 0110 0 | |
| 8 | 0110 1 | |
| 0 | 0111 0 | |
| 6 | 0111 1 | |
| 15 | 10 | |
| 9 | 1100 0 | |
| 3 | 1100 1 | |
| 5 | 1101 0 | |
| 10 | 1101 1 | |
| 12 | 1110 0 | |
| 1 | 1110 10 | |
| 2 | 1110 11 | |
| 7 | 1111 | |

TABLE 11 (b)

| L0, Max = 4 | | |
|---|---|---|
| Index | Done | Data |
| 0 | 0 | ... |
| 1 | 1 | 15 |
| 2 | 0 | ... |
| 3 | 0 | ... |
| 4 | 1 | 7 |
| ... | ... | ... |
| ... | ... | ... |

Let leading bit 1 and M=4 be taken for example. The L values of the VLC codes "1111", "111011", "111010" of Table 1 respectively equal to 4, 3, 3, provided that there are no subsequent bits. Thus, the N value of these VLC codes are equal to 4, and the SE of the code "1111" is decoded as SE=7, and the remaining codes "11" and "10" of the codes "111011" and "111010" respectively become valid codes for the next round of lookup. As indicated in Table 11 (a), the bits with gray background are the bits that is looked up by the algorithm with leading bit 1 and M=4 in the first round of lookup. Table 11 (b) is the first round of lookup table established by the algorithm with leading bit 1 and M=4.

When using the leading bit decoding algorithm, the required lookup table size for establishing lookup table in the round is equal to M+1. Let the first round of lookup table establishment for Table 1 be taken for example. Given that leading bit 0 and M=3, the lookup table size equals 0~3 (denoting there are 0~3 leading bits 0), and SE is respectively decoded as 11 and 13 (as indicated in Table 10 (b)) from the indexes 3 and 2. Given that leading bit 1 and M=4, the index numbers range 0~4 (denoting there are 0~4 leading bits 1), and SE is respectively decoded as 7 and 15 (as indicated in Table 11 (b)) from the indexes 4 and 1.

The leading bit decoding algorithm may also be used in FIG. 1 and FIG. 2, and the details are not repeated here.

In the above embodiments of the present disclosure, if an application program is opened or closed or executes a heavy workload, the free system memory resource and/or the system work load vary, and thus a lookup table is dynamically generated. Therefore, the lookup table is adaptive and may vary in response to the variation in the current system free system memory resource and/or the system work load and/or the target decoding rate.

In the above embodiments of the present disclosure, the content and/or the size of the VLC decoder lookup table vary along with the variation of the free system memory resource. Exemplarily but not restrictively, if the system opens an application program and makes the free memory resource become smaller, or the system closes an application program and makes the free system memory resource become larger, the content and/or the size of the VLC decoder lookup table dynamically generated in the above embodiments of the present disclosure may vary accordingly.

In the above embodiments of the present disclosure, the content and/or the size of the VLC decoder lookup table may vary along with the variation in the current system work load. Exemplarily but not restrictively, if the system opens a new application program and makes the current system work load becomes heavy, if the system closes an application program and makes the current system work load becomes light, if the application program executes a high load task (exemplarily but not restrictively, the system executes video/audio operation in response to user request) and makes the current system work load becomes heavy, or if the application program executes a low load task (exemplarily but not restrictively, if the system executes a document processing in response to user request) and makes the current system work load becomes light, then the content and/or the size of the VLC decoder lookup table dynamically generated in the above embodiments of the present disclosure may vary accordingly.

In the above embodiments of the present disclosure, in response to the variation in the free system memory resource and/or the system work load, the above embodiments of the present disclosure may dynamically generate different VLC decoder lookup tables (with different contents and/or table sizes) with respect to same original VLC table.

In the above embodiments of the present disclosure, during decoding of a symbol, the free system memory resource and/or the system work load may vary, and the VLC decoder lookup tables with different contents and/or table sizes may be dynamically generated for decoding the symbol. That is, during the process of decoding the same symbol, different VLC decoder lookup tables are dynamically generated in the above embodiments of the present disclosure.

Despite the above two embodiments are exemplified by the fixed length decoding algorithm and the leading bit decoding algorithm, the present disclosure is not limited thereto, and other known or unknown lookup table establishing algorithms are within the scope of other possible embodiments of the present disclosure.

Figure 3:
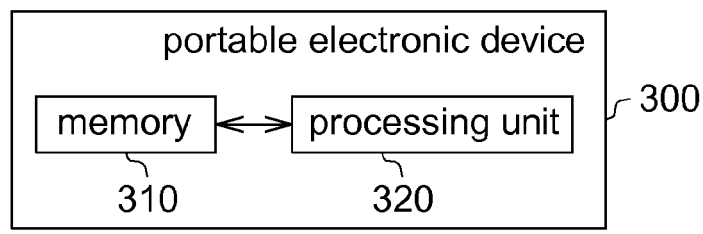
FIG. 3 shows a portable electronic device according to the embodiment of the present disclosure.

Another embodiment of the present disclosure further discloses a portable electronic device, which receives an original VLC table for dynamically generating VLC decoder lookup tables. FIG. 3 shows an electronic device 300 which includes a memory 310 and a processing unit 320. According to the dynamic target decoding rate and the dynamic free resource of the memory 310, the processing unit 320 dynamically establishes an adaptive decoding lookup tables from the original table stored for example in the memory 310. The processing unit 320 may implement any of the above embodiments, and the details are not repeated.

In addition, in the present disclosure, the processing unit 320 may be implemented by a processor, a digital signal processor, a digital video processor, or a programmable integrated circuit such as a microcontroller and a field programmable gate array (FPGA), which is designed with such as hardware description language (HDL).

Furthermore, the above methods of the present disclosure may also be implemented by software programs. For example, the program code of an example of the present disclosure is recorded in a recoding medium such as an ROM, an RAM, and other media of the like, an optical recoding medium, a magnetic recoding medium or other recording media. Furthermore, the program code may also be implemented by firmware. The processing unit may implement the method of the examples of the present disclosure by reading the program code implementing the present disclosure from a recoding media and then execute the program code accordingly. Furthermore, the above methods of the examples of the present disclosure may be implemented by a combination of software and hardware.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A method for generating a decoding lookup table, comprising:
   receiving a variable length coding (VLC) table; and
   dynamically establishing an adaptive decoding lookup table from the VLC table according to a target decoding rate and a free system memory resource;
   wherein, the step of dynamically establishing the adaptive decoding lookup table comprises:
   setting an adaption parameter according to the target decoding rate and the free system memory resource;
   finding all sub VLC tables from a sorted VLC table;
   calculating a respective lookup table size and a respective decoding rate of each of a plurality of table establishing algorithms;
   selecting one from the table establishing algorithms to establish a portion of the adaptive decoding lookup table according to the adaption parameter, the respective lookup table size and the respective decoding rate of the table establishing algorithms; and
   repeating the calculation step and the selection step with respect to the sub VLC tables to establish the adaptive decoding lookup table.

2. The method according to claim 1, wherein, the step of establishing the adaptive decoding lookup table comprises:
   re-establishing a content of the adaptive decoding lookup table in response to a variation in the target decoding rate.

3. The method according to claim 1, wherein, the step of establishing the adaptive decoding lookup table comprises:
   re-establishing a size of the adaptive decoding lookup table in response to a variation in the target decoding rate.

4. The method according to claim 1, wherein, the step of establishing the adaptive decoding lookup table comprises:
   re-establishing a content of the adaptive decoding lookup table in response to a variation in the free system memory resource.

5. The method according to claim 1, wherein, the step of establishing the adaptive decoding lookup table comprises:
   re-establishing a size of the adaptive decoding lookup table in response to a variation in the free system memory resource.

6. The method according to claim 1, wherein, in decoding a to-be-decoded data, the adaptive decoding lookup table is dynamically established if the target decoding rate and/or the free system memory resource is varied.

7. The method according to claim 1, wherein, the respective decoding rates of the table establishing algorithms are calculated according to an appearance possibility of syntax element of VLC table or sub VLC table.

8. The method according to claim 1, wherein, different adaptive decoding lookup tables are dynamically generated in decoding an identical symbol of the VLC table.

9. The method according to claim 1, wherein, the calculation step and the selection step are repeatedly performed to the sub VLC tables until the number of the sub VLC tables equals 0.

10. The method according to claim 1, wherein, the number of VLC tables is plural.

11. A portable electronic device, comprising:
a memory, storing a variable length coding (VLC) table; and
a processing unit, dynamically establishing an adaptive decoding lookup table from the VLC table according to a target decoding rate and a free system memory resource;
wherein:
setting a adaption parameter by the processing unit according to the target decoding rate and the free system memory resource;
finding all sub VLC tables from a sorted VLC table by the processing unit;
calculating a respective lookup table size and a respective decoding rate of a plurality of table establishing algorithms;
selecting one from the table establishing algorithms by the processing unit to establish a portion of the adaptive decoding lookup table according to the adaption parameter, the respective lookup table size and the respective decoding rate of the table establishing algorithms; and
repeatedly performing the calculation operation and the selection operation with respect to the sub VLC tables by the processing unit to establish the adaptive decoding lookup table.

12. The portable electronic device according to claim 11, wherein, a content of the adaptive decoding lookup table is re-established by the processing unit in response to a variation in the target decoding rate.

13. The portable electronic device according to claim 11, wherein, a size of the adaptive decoding lookup table is re-established by the processing unit in response to a variation in the target decoding rate.

14. The portable electronic device according to claim 11, wherein, a content of the adaptive decoding lookup table is re-established by the processing unit in response to a variation in the free system memory resource.

15. The portable electronic device according to claim 11, wherein, a size of the adaptive decoding lookup table is re-established by the processing unit in response to a variation in the free system memory resource.

16. The portable electronic device according to claim 11, wherein, in decoding a to-be-decoded data, the adaptive decoding lookup table is dynamically established by the processing unit if the target decoding rate and/or the free system memory resource is varied.

17. The portable electronic device according to claim 11, wherein, the respective decoding rates of the table establishing algorithms are calculated by the processing unit according to an appearance possibility of the syntax element of sub VLC table or VLC table.

18. The portable electronic device according to claim 11, wherein, different adaptive decoding lookup tables are dynamically generated in decoding an identical symbol of the VLC table.

19. The portable electronic device according to claim 11, wherein, the calculation operation and the selection operation are repeated performed to the sub VLC tables by the processing unit until the number of the sub VLC tables equals 0.

20. The portable electronic device according to claim 11, wherein, the number of VLC tables is plural.

* * * * *